United States Patent
Nakamura et al.

(10) Patent No.: US 6,489,769 B2
(45) Date of Patent: Dec. 3, 2002

(54) NUCLEAR MAGNETIC RESONANCE APPARATUS

(75) Inventors: Takashi Nakamura, Wako (JP); Jun Uzawa, Wako (JP); Tetsuo Oka, Obu (JP); Yoshitaka Ito, Chiryu (JP); Yousuke Yanagi, Chiryu (JP); Masaaki Yoshikawa, Kariya (JP); Ryohei Yabuno, Toyota (JP); Uichiro Mizutani, Nagoya (JP)

(73) Assignees: Riken (JP); Aisin Seiki Kabushiki Kaisha (JP)

( * ) Notice: Subject to any disclaimer, the term of this patent is extended or adjusted under 35 U.S.C. 154(b) by 0 days.

(21) Appl. No.: 09/888,526

(22) Filed: Jun. 26, 2001

(65) Prior Publication Data

US 2002/0000806 A1 Jan. 3, 2002

(30) Foreign Application Priority Data

Jun. 26, 2000 (JP) ........................................ 2000-191007

(51) Int. Cl.$^7$ ................................................. G01V 3/00
(52) U.S. Cl. ........................ 324/318; 324/315; 324/321
(58) Field of Search ................................. 324/318, 315, 324/319, 321; 335/216, 306, 302

(56) References Cited

U.S. PATENT DOCUMENTS 5,412,363 A * 5/1995 Breneman et al. .......... 335/216
5,563,564 A * 10/1996 Chu et al. ................... 335/216
5,764,121 A * 6/1998 Wheatley et al. ........... 335/216
6,169,402 B1 * 1/2001 Oka et al. ................... 324/318

FOREIGN PATENT DOCUMENTS

| JP | 09-135823 A | 5/1997 |
| JP | 11-248810 A | 9/1999 |

* cited by examiner

Primary Examiner—Edward Lefkowitz
Assistant Examiner—Brij B. Shrivastav
(74) Attorney, Agent, or Firm—Griffin & Szipl, P.C.

(57) ABSTRACT

A nuclear magnetic resonance apparatus including: a cup-shaped high-temperature superconductor 20 having a hollow cylindrical shape or portion cooled to not more than a superconducting transition temperature in a vacuum insulating container 22; and a detection coil 12 for detecting an NMR signal of a material 11 to be measured inserted into the hollow cylindrical portion 20a of the high-temperature superconductor. The high-temperature superconductor is magnetized in an axial direction, a static magnetic field is thereby generated in the hollow cylindrical portion in a cylinder axial direction, and the NMR signal of a material is detected by the detection coil and the existing spectrometer. A strong static magnetic field comparable to a conventional superconducting magnet is formed without using a refrigerant (liquid helium) essential for operating the conventional superconducting magnet, and a strength distribution of the static magnetic field is homogeneous.

10 Claims, 6 Drawing Sheets

NUCLEAR MAGNETIC RESONANCE APPARATUS

BACKGROUND OF THE INVENTION

1. Field of the Invention

The present invention relates to a nuclear magnetic resonance apparatus which uses a nuclear magnetic resonance (NMR) signal and which can be utilized in a medical field, and in analyzing a component and structure of an industrial material, agricultural produce, and the like. The present invention particularly relates to a nuclear magnetic resonance apparatus for generating a strong static magnetic field which is comparable to a conventional superconducting magnet in a homogeneity aria without using liquid helium.

2. Description of Related Art

A nuclear magnetic resonance is a phenomenon in a magnetic system including a magnetic moment and angular momentum, and is a resonance phenomenon in a frequency (Larmor frequency) inherent in the magnetic system. For example, as shown in FIG. 1, a static magnetic field $H_0$ made by a magnet is applied to a sample, and a radio frequency magnetic field $H_1$ is further applied to the sample from a direction vertical to the static magnetic field via a transmission coil. At present, a pulse nuclear magnetic resonance (NMR) apparatus is a mainstream, in which a very short (3 to 6 $\mu s$) and strong high-frequency pulse is applied to the sample, and all signals spreading in a chemical shift are simultaneously resonated and simultaneously observed.

Moreover, in order to obtain a image, a magnetic field whose strength differs with a position called a gradient magnetic field is superimposed onto the static magnetic field, and a position is identified by shifting a resonance frequency for each position. An image method of exciting (selectively exciting) a predetermined section only by a necessary thickness with a high frequency, subsequently applying the gradient magnetic field in two directions in the section, and obtaining the sectional image by a two-dimensional Fourier method is generally used.

The aforementioned nuclear magnetic resonance apparatus (hereinafter referred to as an NMR apparatus) utilizing the aforementioned nuclear magnetic resonance phenomenon is basically constituted of a magnet for forming the static magnetic field, a coil for generating another high-frequency pulse and detecting an NMR signal, a receiver for receiving the NMR signal, and the like. Data useful in analyzing a structure of an organic compound, such as a chemical shift amount of each atom and spin-spin coupling constant can be obtained by the NMR apparatus.

Moreover, a magnetic resonance imaging apparatus (hereinafter referred to as an MRI apparatus) utilizing the nuclear magnetic resonance phenomenon is constituted of: at least a magnet as static magnetic field generation means; a gradient magnetic field for applying space information to the signal; a high-frequency irradiation system; an NMR signal detection system; a probe coil which surrounds a test object such as a human body and actually performs high-frequency irradiation and signal detection; and a controller for controlling these components and processing the obtained signal. A space distribution of a nuclide which generates the signal is visualized by the nuclear magnetic resonance (NMR) signal obtained by irradiating the test object disposed in the presence of the static magnetic field with the high frequency. Since the MRI apparatus does not use a X-ray, the apparatus is safe not only for the human body subjected to a measuring operation but also for an object to be measured including the human body, a sufficient resolution is obtained, and a practical value is remarkably high.

As the static magnetic field generating magnet constituting the nuclear magnetic resonance apparatus, a resistive magnet of 0.5 to 2.2 T, and a superconducting magnet of 0.5 to 18.8 T have heretofore been used, and a permanent magnet is also used in some case. The static magnetic field generating magnet of the nuclear magnetic resonance apparatus has an enhanced sensitivity for a ferromagnetic field, and enables analysis of a large amount of detailed information. Therefore, the superconducting magnet using a superconducting material is superior in the strength, stability and uniformity of the magnetic field.

Therefore, in the recent nuclear magnetic resonance apparatus, the superconducting magnet using a superconducting coil formed of a metal-based superconducting wire material such as niobium and titanium is used to form a main magnetic field (static magnetic field). However, when the superconducting coil is utilized, liquid helium is used to cool the coil at an extremely low temperature. This raises a problem that a large amount of expensive liquid helium is required and running cost is high.

Moreover, the metal-based superconducting wire material such as niobium and titanium is produced by a complicated manufacturing process and thermal treatment. Therefore, the superconducting coil is much more expensive than a usual electromagnet coil formed of a copper wire, and the apparatus main body becomes extremely expensive. Additionally, a refrigerant (liquid helium and liquid nitrogen) utility for operating the superconducting magnet requires a special technique, and is technically complicated and intricate. Therefore, it is difficult to say that the utilization is a simple technique. These big problems hinder a high-performance nuclear magnetic resonance apparatus from spreading.

Furthermore, since the superconducting magnet requires a large cooling structure, and a leak magnetic field is also huge, an exclusive room for installing the magnet is necessary. This remarkably limits an apparatus installation condition, and also limits an apparatus utilization field.

On the other hand, an example of a small and simple nuclear magnetic resonance apparatus is proposed in Japanese Patent Application Laid-Open No. 135823/1997, in which a direct cooling type superconducting magnet is used instead of the conventional helium cooling type superconducting magnet. This nuclear magnetic resonance apparatus is more convenient than the apparatus using the conventional helium cooling type superconducting magnet, but the superconducting coil formed of the superconducting wire material is used to form the main magnetic field. Since the superconducting wire material is extremely expensive, the whole apparatus becomes expensive. Moreover, since a refrigerator is used to cool the superconducting coil in a vacuum container, a coil portion becomes large-sized. In this case, the advantage that the apparatus is small-sized and convenient cannot sufficiently be utilized. Furthermore, since a heat capacity of the superconducting coil is large, a time necessary for cooling the coil at a predetermined temperature with the refrigerator is long. There is also a problem that a time from the start of cooling until the start of measurement is long.

To solve the aforementioned conventional problem, the present applicant of the present invention has developed and filed a prior application for the nuclear magnetic resonance apparatus in which a high-temperature superconductor is used (Japanese Patent Application Laid-Open No. 248810/ 1999). In this apparatus, a superconducting current flows through the high-temperature superconductor which is cooled in a vacuum insulating container and to which the magnetic field is applied. Then, the superconductor captures the magnetic field to constitute a magnetic field supply member, the magnetic field is used as the main magnetic field, and the NMR signal of a material to be measured disposed in the magnetic field is detected by a detection coil and spectrometer disposed adjacent to the material to be measured.

In the nuclear magnetic resonance apparatus, the superconducting current flows through the high-temperature superconductor, the magnetic field is captured, and the magnetic field supply member is constituted. Therefore, a strong static magnetic field comparable to the conventional superconducting magnet can be formed without using the expensive liquid helium.

However, as shown in FIG. 2, a magnetic field distribution generated in the conventional high-temperature superconductor forms a mountain-shaped distribution whose center is high in strength. This raises a problem that a uniform magnetic field cannot be applied to the material (sample) to be measured. Moreover, for example, when another permanent magnet, electromagnetic soft iron, or the like is disposed in a position apart from the high-temperature superconductor in order to uniform the magnetic field, a uniform magnetic field area can be formed. However, there is a problem that the magnetic field strength is remarkably lowered.

SUMMARY OF THE INVENTION

The present invention has been developed to solve the problem. That is, an object of the present invention is to provide a nuclear magnetic resonance apparatus which can form a strong static magnetic field comparable to a conventional superconducting magnet without using a refrigerant (liquid helium) essential for operating the conventional superconducting magnet, and which can make homogeneity aria of the static magnetic field.

According to the present invention, there is provided a nuclear magnetic resonance apparatus comprising: a cup-shaped high-temperature superconductor (20) having a hollow cylindrical shape or a hollow cylindrical portion cooled at a temperature not more than a superconducting transition temperature in a vacuum insulating container (22); and a detection coil (12) for detecting an NMR signal of a material (11) to be measured inserted into the hollow cylindrical portion (20a) of the high-temperature superconductor. The high-temperature superconductor is magnetized in an axial direction, a static magnetic field is thereby generated in the hollow cylindrical portion in a cylinder axial direction, and the NMR signal of the material to be measured disposed in the magnetic field is detected by the detection coil and a spectrometer.

According to the constitution of the present invention, when a hole is made in a center of a bulk magnet calcined in a cylindrical shape in the axial direction, a uniform magnetic field distribution can be obtained inside the hole.

That is, when the center of the bulk magnet calcined in the cylindrical shape is holed in the axial direction, the high-temperature superconductor (20) having the hollow cylindrical shape can be formed. A superconducting current is generated centering on an axial center of the high-temperature superconductor to magnetize the high-temperature superconductor, so that the high-temperature superconductor can function similarly as the conventional superconducting coil. Therefore, a substantially uniform magnetic field distribution can be obtained in a state equivalent to a state in which the coil is wound.

Therefore, the strong static magnetic field comparable to the conventional superconducting magnet can be formed without using the refrigerant (liquid helium) essential for operating the conventional superconducting magnet, and the strength distribution of the static magnetic field can be homogeneous.

According to a preferred embodiment of the present invention, a plurality of high-temperature superconductors (20) are coaxially disposed opposite to each other in the axial direction, or at a gap therebetween.

According to the constitution, when the static magnetic field formed by the plurality of high-temperature superconductors (20) is multilayered, the strong static magnetic field can be formed in a broader area.

Moreover, the detection coil (12) is preferably disposed in the vacuum insulating container (22). In the constitution, the detection coil (12) is thermally shut off from the outside in the vacuum insulating container and cooled in the same temperature range as that of the high-temperature superconductor under insulation. The detection coil (12) reduces a thermal noise, and improves electric conductivity, and sensitivity is enhanced.

Furthermore, the high-temperature superconductor (20) is an oxide superconductor whose main component is represented by RE—Ba—Cu—O. The superconductor contains 0 to 50% of at least one of silver, platinum and cerium, and RE is synthesized by at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho). Moreover, a structure is included in which a superconducting phase having a superconducting transition temperature of 90 K to 96 K in terms of an absolute temperature and an allotrope insulating phase disposed inside the superconducting phase are dispersed with a particle size of 50 $\mu$m or less, preferably 10 $\mu$m or less.

The yttrium-based, neodymium-based, samarium-based, and other high-temperature superconductors having the superconducting transition temperature Tc of 90 Kelvin (K) or more in terms of the absolute temperature are synthesized in a so-called melting method of heating and melting the materials once at a temperature higher than a melting point, and coagulating the materials again. Then, a molded material with a rough and large grown crystal is obtained, and this is called the superconducting bulk. A structure in which the insulating phase is finely dispersed is obtained in a superconducting parent phase, a pinned point attributed to the presence of the dispersed phase captures a magnetic flux, and the superconducting bulk serves as a pseudo permanent magnet.

The superconducting bulk synthesized by the melting method has the superconducting transition temperature of 90K to 96K in terms of the absolute temperature, and includes a structure in which a large crystal formed of the superconducting phase with a size of 1 mm to 100 mm, and the allotrope insulating phase disposed inside the large crystal are dispersed with a particle size of 50 $\mu$m or less (preferably 10 $\mu$m or less).

When the allotrope insulating phase dispersed in the structure is 50 $\mu$m or less during synthesis of the high-temperature superconductor, a satisfactory magnetic field capture property appears, a 0.5 T class magnetic field is generated, and the high-temperature superconductor can be used in the present invention. In a certain system to which platinum and cerium are added, the insulating phase can be controlled to be 10 μm or less. In this case, the magnetic field having an extremely excellent property of 1 T class or a higher class or several T can be captured, and the present invention can highly be utilized. Moreover, in a system to which 0 to 50% of silver is added, a crack easily introduced in a synthesis stage or a use stage is prevented from being generated or propagated, and a large-sized high-temperature superconductor can advantageously and soundly be synthesized and used.

When the high-temperature superconductor is used, a superconducting state can be realized at the absolute temperature of 90K or more which exceeds a boiling point of 77K of liquid nitrogen. Additionally, when the high-temperature superconductor is cooled at a lower temperature, the strong static magnetic field comparable to the conventional superconducting magnet can be formed.

The magnetic field of the high-temperature superconductor can be magnetized by the static magnetic field. When the strong static magnetic field is generated by the conventional metal-based superconducting coil, and the magnetic field is captured by the high-temperature superconductor, the high-temperature superconductor can be magnetized by the strong static magnetic field able to be generated by the metal-based superconducting coil.

Moreover, the high-temperature superconductor may also be magnetized by a pulse magnetic field. When a large magnetic field is momentarily generated in the coil to magnetize the high-temperature superconductor, the high-temperature superconductor can more easily be magnetized.

Furthermore, it is preferable to cool the high-temperature superconductor at a temperature not more than the superconducting transition temperature in a refrigerant, by a cooling portion of a refrigerator, or by the refrigerant cooled by the refrigerator. As the refrigerator, a pulse tube refrigerator, GM cycle refrigerator, Solvay cycle refrigerator, Stirling cycle refrigerator, and Peltier refrigerator are preferably used alone or as a combination of two or more thereof.

As the refrigerant, a gas, liquid, or solid (excluding helium) of nitrogen, oxygen, argon, helium, neon, hydrogen, or the like can be used. This can easily cool the high-temperature superconductor at a temperature which is not more than the superconducting transition temperature (e.g., about 90K).

In a structure for cooling the high-temperature superconductor, copper or another metal, or an alumina single crystal or another heat transfer material directly contacts and cools the high-temperature superconductor, and the metal or the heat transfer material is cooled by the refrigerants such as liquid nitrogen or the aforementioned various refrigerators.

In another structure, the high-temperature superconductor is cooled by the liquid, gas or solid refrigerant such as liquid nitrogen, liquid helium, and solid nitrogen gas which is cooled by the refrigerator. In this case, since the superconductor is separated from the refrigerator, a mechanical influence of the refrigerator can be cut off, and measurement precision can be enhanced.

Other objects and advantageous characteristics of the present invention will be apparent from the following description with reference to the accompanying drawings.

DETAILED DESCRIPTION OF THE PREFERRED EMBODIMENTS

Figure 1:
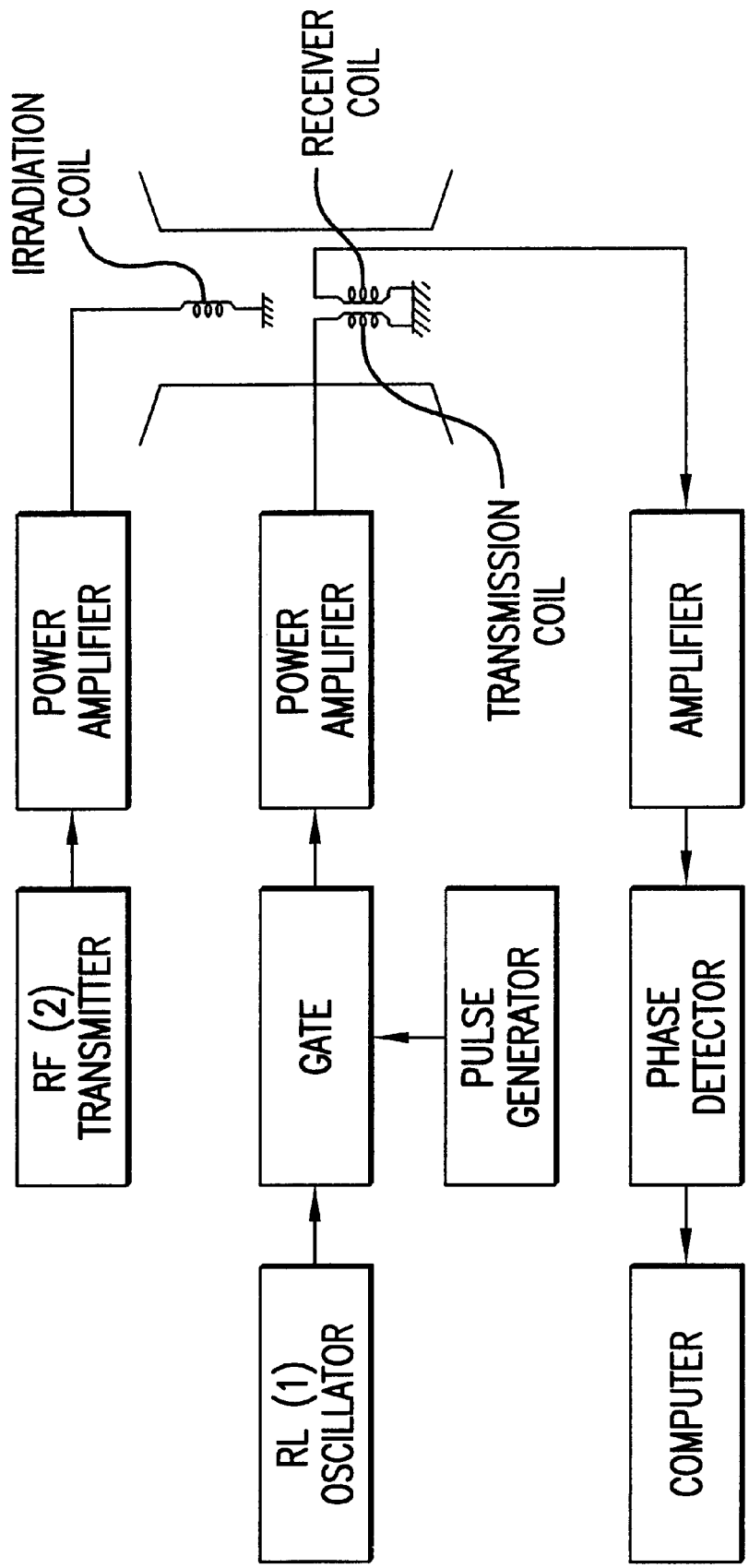
FIG. 1 is a principle diagram of a pulse FTNMR.
Figure 2:
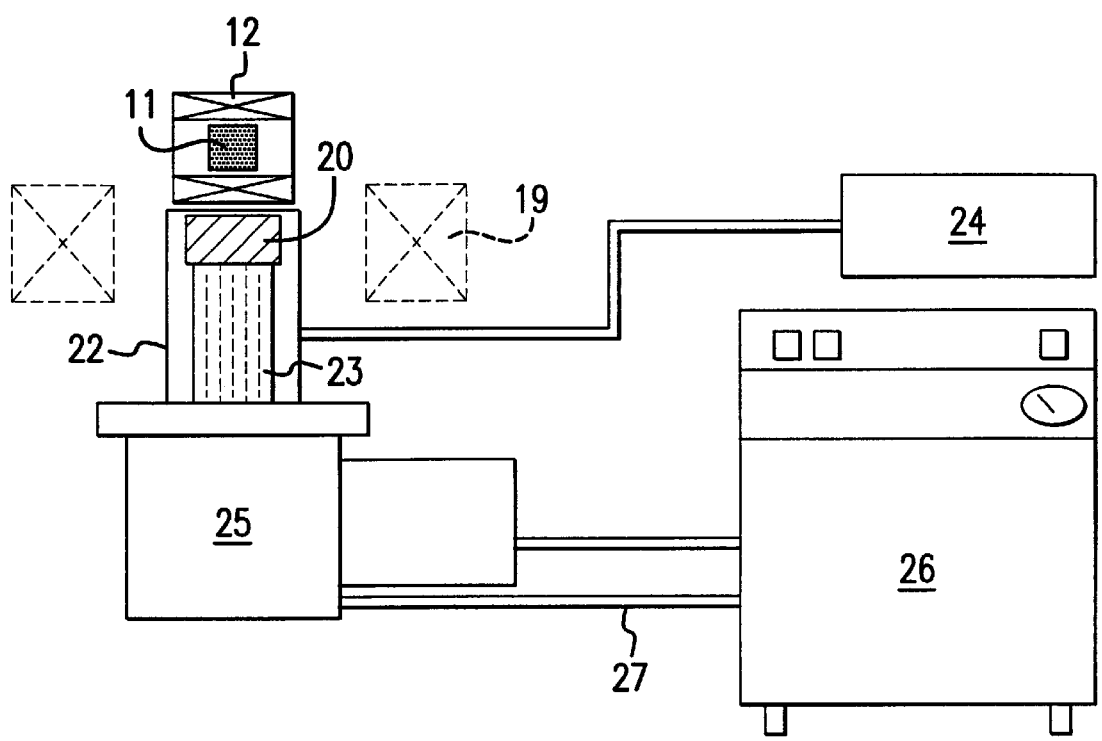
FIG. 2 is a magnetic field distribution diagram of a conventional high-temperature superconductor.

Preferred embodiments of the present invention will be described hereinafter with reference to the drawings. Common portions in the respective drawings are denoted with the same reference numerals, and redundant description will be omitted.

Figure 3:
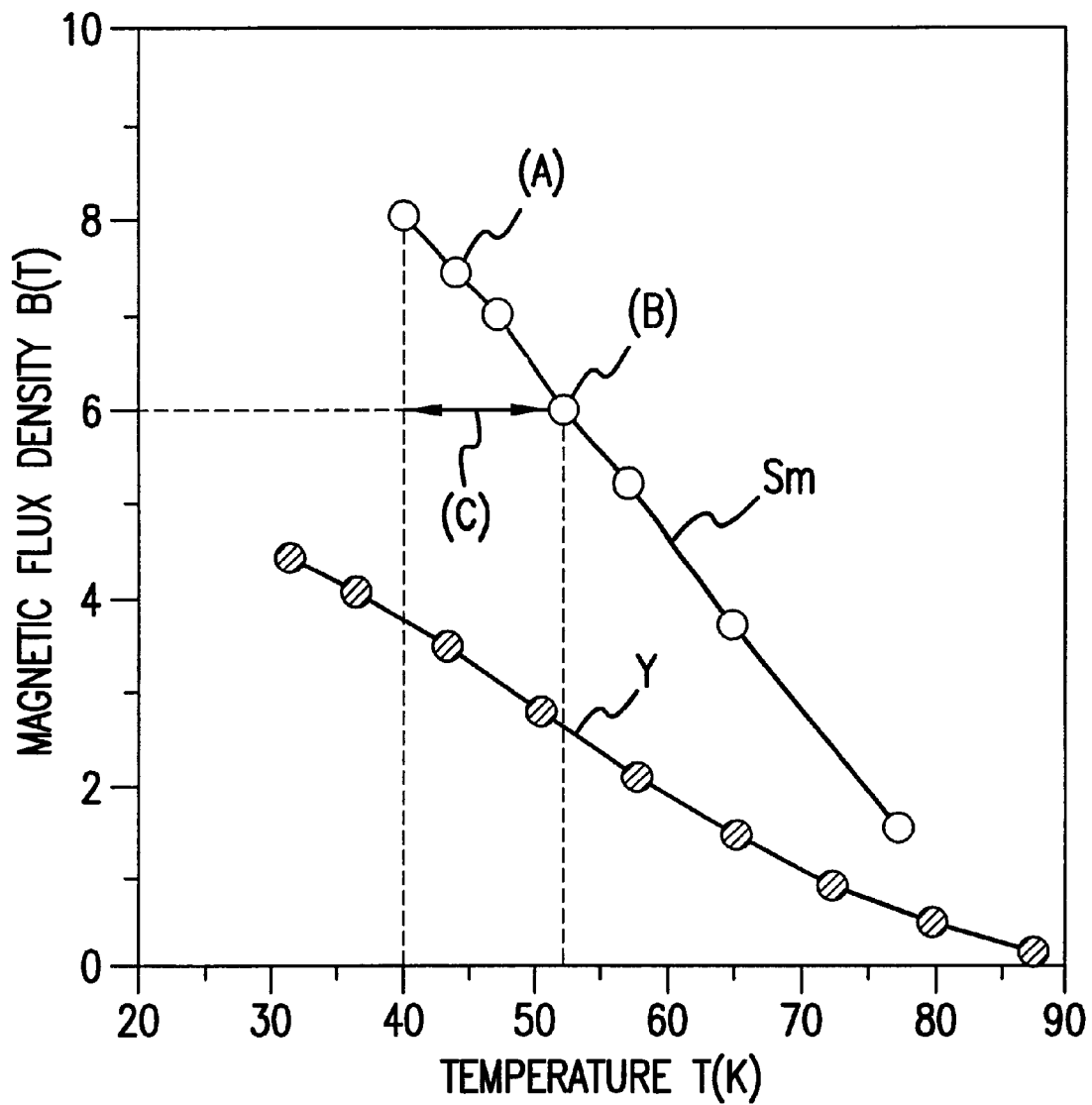
FIG. 3 is a whole constitution diagram of a first embodiment of a nuclear magnetic resonance apparatus according to the present invention.
Figure 4:
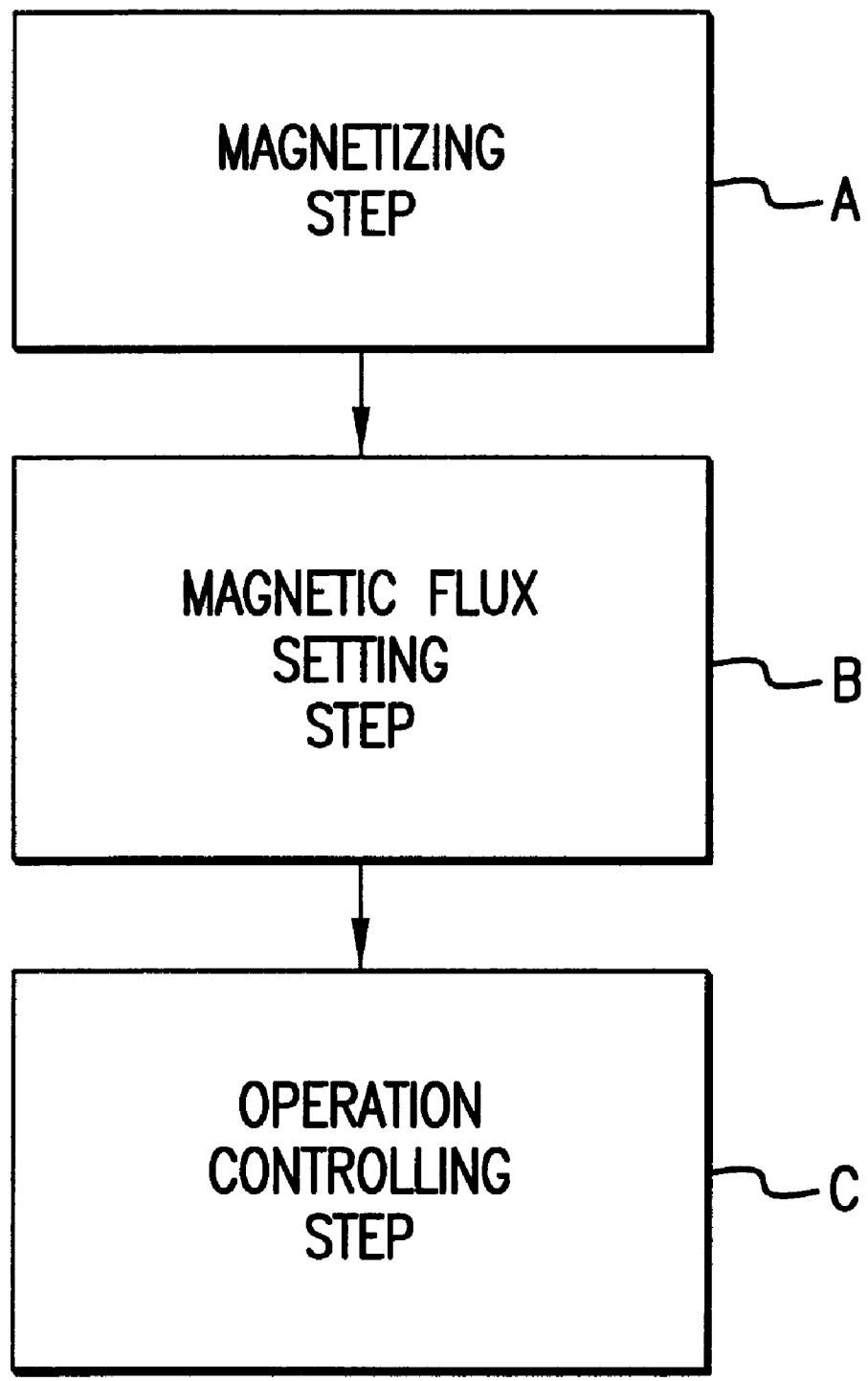
FIG. 4 is a partial enlarged view of FIG. 3.

FIG. 3 is a whole constitution diagram of a first embodiment of a nuclear magnetic resonance apparatus according to the present invention, and FIG. 4 is a partial enlarged view of FIG. 3. In FIG. 3, reference numeral 13 denotes a high frequency generation apparatus, 14 denotes a pulse programmer (transmitter), 15 denotes a high frequency amplifier, 16 denotes a preamplifier (signal amplifier), 17 denotes a phase detector (receiver), 18 denotes an analog digital converter (ADC), and 19 denotes a computer.

In FIG. 3 and FIG. 4, a material 11 to be measured is disposed inside a detection coil 12 wound around the material. A pulse is applied to the material to be measured via a transmission coil from a high-frequency oscillator, GATE portion for shaping a pulse, and power amplifier for amplifying the high-frequency pulse. A free induction decay (FID) generated immediately after the pulse is received by a reception coil, the pulse is transmitted through the subsequent amplifier and phase detector, and an AD converted signal is stored in the computer. The data is subjected to Fourier transform, and an analysis result of NMR is displayed on the computer, or information mapped as MRI is obtained.

In the first embodiment, a high-temperature superconductor 20 has a hollow cylindrical shape, and is cooled at a temperature which is not more than a superconducting transition temperature in a vacuum insulating container 22. The material 11 to be measured is inserted into a hollow cylindrical portion 20a of the high-temperature superconductor 20. The detection coil 12 is wound/disposed so as to detect an NMR signal of the material 11 to be measured inside the hollow cylindrical portion 20a. Additionally, the high-temperature superconductor 20 may have a cup shape including the hollow cylindrical portion 20a.

According to the present invention constituted as described above, the high-temperature superconductor 20 is magnetized by generating a superconducting current which centers on a shaft center of the superconductor, so that a static magnetic field is generated in the hollow cylindrical portion in a cylinder axial direction. The NMR signal of the material to be measured disposed in the magnetic field is detected by the detection coil and the existing spectrometer.

The high-temperature superconductor 20 is an oxide superconductor whose main component is represented by RE—Ba—Cu—O. The superconductor contains 0 to 50% of at least one of silver, platinum and cerium, and RE is synthesized by at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho). Moreover, a structure is preferably included in which a superconducting phase having a superconducting transition temperature of 90K to 96K in terms of an absolute temperature and an allotrope insulating phase disposed inside the superconducting phase are dispersed with a particle size of 50 $\mu$m or less, preferably 10 $\mu$m or less.

The superconductor bulk 20 is cooled at a temperature not more than the superconducting transition temperature in liquid nitrogen or by a cooling portion of a refrigerator. As the refrigerator, a small-sized refrigerator is mainly used. A pulse tube refrigerator, GM cycle refrigerator, Solvay cycle refrigerator, Stirling refrigerator, and Peltier refrigerator are used alone or as a combination of two or more thereof. In the constitution, the superconducting bulk is cooled without any intricate operation of a refrigerant (liquid helium and liquid nitrogen). Thereafter, the superconducting bulk is magnetized by the pulse magnetic field, and functions as a superconducting permanent magnet. Alternatively, the magnetization is performed by cooling the bulk at the temperature not more than the superconducting transition temperature while applying the static magnetic field to the bulk. The magnetized superconducting bulk generates the magnetic field from the vacuum container, the material to be measured is disposed in the magnetic field, and the magnetic field is applied to the material to be measured. The coil is disposed around and in the vicinity of the material to be measured, and the NMR signal is detected via an oscillation detector.

In FIG. 3, the hollow cylindrical high-temperature superconductor 20 is disposed in the vacuum insulating container 22, brought to contact with a cooling portion 23 (cold head) of the refrigerator, and fixed. A vacuum pump 24 reduces a pressure of the vacuum insulating container 22 and brings the container to an insulating state. A refrigerator and compressor 26 are operated to lower the temperature of the high-temperature superconductor 20 and to bring the superconductor to a superconducting state.

In the nuclear magnetic resonance apparatus of the present invention, the magnetic field of the high-temperature superconductor 20 can be magnetized by the static magnetic field. That is, the superconducting bulk 20 in the vacuum insulating container 22 is cooled. During or after cooling, a strong static magnetic field is generated by a conventional metal-based superconducting coil 28, and the bulk magnet 20 is disposed in the magnetic field. While the magnetic field is applied to the bulk during cooling, the bulk is allowed to capture the magnetic field. After the bulk is completely cooled at a predetermined temperature and the magnetic field is captured, the metal-based superconducting coil 28 is demagnetized and removed. Since a temperature rise of the high-temperature superconductor 20 during magnetization can be avoided by the magnetization (field cool) by the static magnetic field, the high-temperature superconductor 20 can capture a very strong static magnetic field.

The magnetic field of the high-temperature superconductor 20 may also be magnetized by a pulse magnetic field. According to this method (pulse magnetizing method), the bulk magnet can be magnetized by momentarily generating a large magnetic field in the coil 28. The method is superior in stability of the magnetic field as compared with the magnetizing method by the static magnetic field. Because the magnetization can easily be performed with a simple and easy apparatus and the magnetized magnet can be held at a lower temperature.

Figure 5:
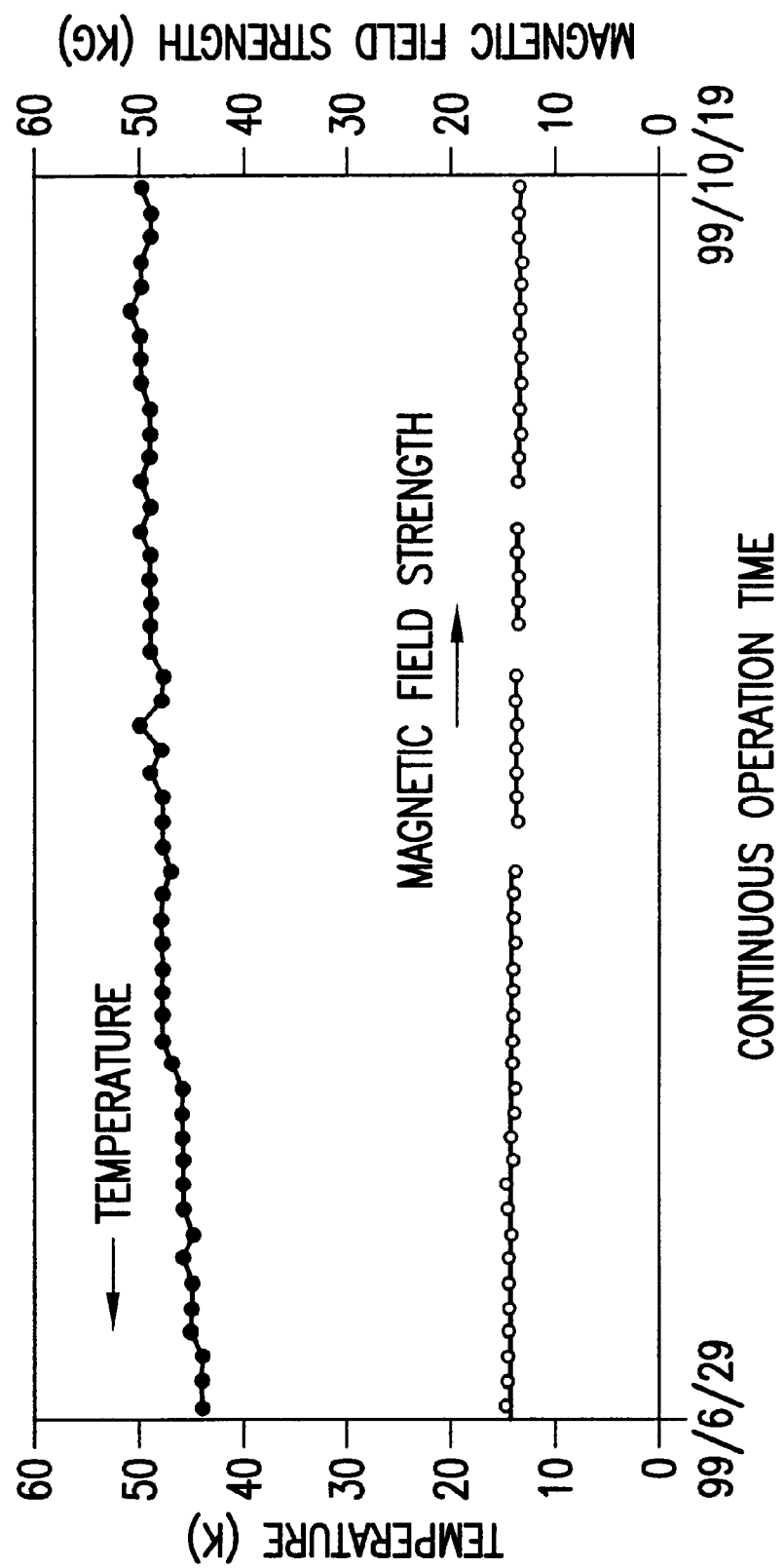
FIG. 5 is a partial enlarged view of a second embodiment of the nuclear magnetic resonance apparatus according to the present invention.

FIG. 5 is a partial enlarged view of a second embodiment of the nuclear magnetic resonance apparatus according to the present invention. In FIG. 5, two high-temperature superconductors 20 are coaxially disposed at a gap in the axial direction. A conductor member 17 having a high heat conductivity holds two high-temperature superconductors 20, contacts the cooling portion 23, and sets two high-temperature superconductors 20 to the same temperature.

According to this constitution, the static magnetic field by a plurality of high-temperature superconductors 20 is multilayered so that a stronger static magnetic field can be formed in a broader area. A distribution state of the static magnetic field generated by superimposing the plurality of high-temperature superconductors can be adjusted by the magnetization strength or the gap of the superconductors. Therefore, the plurality of high-temperature superconductors are coaxially disposed in contact with one another or at an arbitrary gap from one another in the axial direction.

Figure 6:
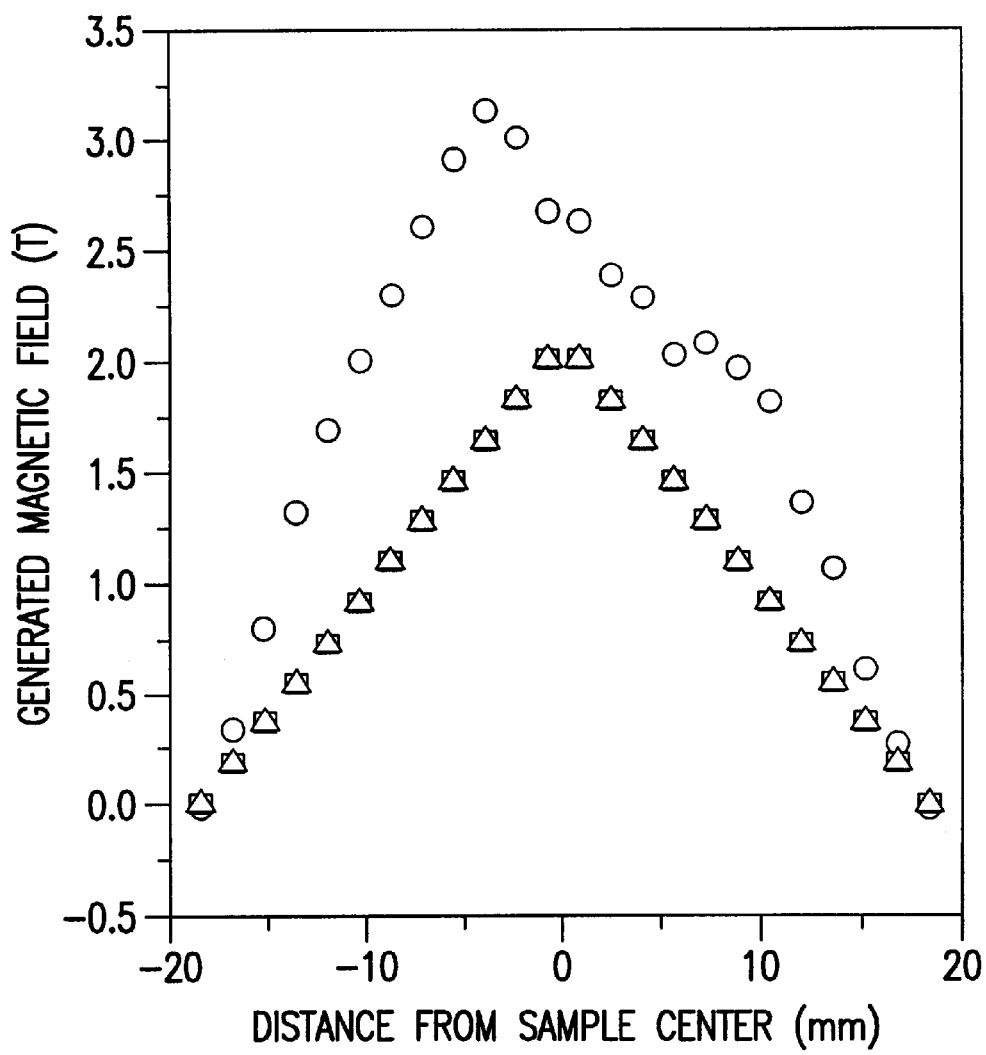
FIG. 6 is a partial enlarged view of a third embodiment of the nuclear magnetic resonance apparatus according to the present invention.

FIG. 6 is a partial enlarged view of a third embodiment of the nuclear magnetic resonance apparatus according to the present invention. In FIG. 6, four high-temperature superconductors 20 are coaxially disposed in contact with one another or at the gap from one another in the axial direction. The conductor member 17 having a high heat conductivity holds four high-temperature superconductors 20, contacts the cooling portion 23, and sets four high-temperature superconductors 20 to the same temperature. According to this constitution, the static magnetic field by a multiplicity of (four in this example) high-temperature superconductors 20 is multilayered so that the stronger static magnetic field can be formed in the broader area. The detection coil 12 is disposed inside or outside the vacuum insulating container as the occasion demands.

When the detection coil 12 is disposed inside the vacuum insulating container 22, and cooled at the same low temperature as that of the high-temperature superconductor 20 thermally shut off from the vacuum insulating container, thermal noise can be reduced by holding the detection coil 12 at the low temperature. Therefore, electric conductivity is improved, and sensitivity is enhanced.

According to the aforementioned constitution of the present invention, when a hole is made in a center of the bulk magnet 20 calcined in a cylindrical shape in the axial direction, a uniform magnetic field distribution can be obtained inside the hole.

That is, when the hole is made in the center of the bulk magnet calcined in the cylindrical shape in the axial direction, the cupped high-temperature superconductor 20 having a hollow cylindrical shape or a hollow cylindrical portion can be formed. When the superconducting current is generated centering on the shaft center of the high-temperature superconductor to magnetize the superconductor, the high-temperature superconductor can function similarly as the conventional superconducting coil, and a substantially uniform magnetic field distribution can be obtained similarly as in the coil wound state.

Therefore, the strong static magnetic field comparable to the conventional superconducting magnet can be formed without using the refrigerant (liquid helium) essential for operating the conventional superconducting magnet, and the strength distribution of the static magnetic field can be homogeneous.

Additionally, some preferred embodiments of the present invention have been described above, but it will be understood that the scope of right included in the invention is not limited by these embodiments. On the contrary, the scope of right of the present invention includes all of improvements, modifications, and equivalents included in the scope of the appended claims.

What is claimed is:

1. A nuclear magnetic resonance apparatus comprising: a cup-shaped high-temperature superconductor (20) having a hollow cylindrical shape or a hollow cylindrical portion cooled at a temperature not more than a superconducting transition temperature in a vacuum insulating container (22); and a detection coil (12) for detecting an NMR signal of a material (11) to be measured inserted into the hollow cylindrical portion (20a) of the high-temperature superconductor, wherein the high-temperture superconductor is magnetized in an axial direction, a static magnetic field is thereby generated in the hollow cylindrical portion in a cylinder axial directions, and the NMR signal of the material to be measured disposed in the magnetic field inside the cup-shaped high-temperature superconductor is detected by the detection coil and a spectrometer.

2. The nuclear magnetic resonance apparatus according to claim 1 wherein a plurality of said high-temperature superconductors are coaxially disposed opposite to each other and in contact with each other in an axial direction.

3. The nuclear magnetic resonance apparatus according to claim 1 wherein a plurality of said high-temperature superconductors are coaxially disposed opposite to each other and at a gap from each other in an axial direction.

4. The nuclear magnetic resonance apparatus according to claim 1 wherein said detection coil is disposed inside the vacuum insulating container.

5. The nuclear magnetic resonance apparatus according to any one of claims 1 to 4 wherein said high-temperature superconductor is an oxide superconductor whose main component is represented by RE—Ba—Cu—O, and contains 0 to 50% of at least one of silver, platinum and cerium, RE is synthesized of at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho).

6. The nuclear magnetic resonance apparatus according to claim 5 wherein the magnetic field of the high-temperature superconductor is magnetized by the static magnetic field.

7. The nuclear magnetic resonance apparatus according to claim 5 wherein the magnetic field of the high-temperature superconductor is magnetized by a pulse magnetic field.

8. The nuclear magnetic resonance apparatus according to claim 5 wherein said high-temperature superconductor is cooled at a temperature not more than a superconducting transition temperature in a refrigerant, by a cooling portion of a refrigerator, or by the refrigerant cooled by the refrigerator.

9. The nuclear magnetic resonance apparatus according to claim 8 wherein as the refrigerator, a pulse tube refrigerator, a GM cycle refrigerator, a Solvay cycle refrigerator, a Stirling cycle refrigerator, and a Peltier refrigerator are used alone or as a combination of two or more thereof.

10. The nuclear magnetic resonance apparatus according to claims 5 wherein said high-temperature superconductor includes a structure in which a superconducting phase having a superconducting transition temperature of 90 K to 96 K in terms of an absolute temperature and an allotrope insulating phase disposed inside the superconducting phase are dispersed with a particle size of 50 $\mu$m or less, preferably 10 $\mu$m or less.

* * * * *